United States Patent
Komaba et al.

(10) Patent No.: US 6,828,541 B2
(45) Date of Patent: Dec. 7, 2004

(54) LIGHT RECEIVING ELEMENT ARRAY HAVING ISOLATED PIN PHOTODIODES

(75) Inventors: Nobuyuki Komaba, Osaka (JP); Takashi Tagami, Osaka (JP); Yasunori Arima, Osaka (JP); Yukihisa Kusuda, Osaka (JP)

(73) Assignee: Nippon Sheet Glass Co., Ltd., Osaka (JP)

(*) Notice: Subject to any disclaimer, the term of this patent is extended or adjusted under 35 U.S.C. 154(b) by 73 days.

(21) Appl. No.: 10/088,268

(22) PCT Filed: Jul. 16, 2001

(86) PCT No.: PCT/JP01/06121

§ 371 (c)(1),
(2), (4) Date: Sep. 23, 2002

(87) PCT Pub. No.: WO02/07226

PCT Pub. Date: Jan. 24, 2002

(65) Prior Publication Data

US 2003/0106987 A1 Jun. 12, 2003

(30) Foreign Application Priority Data

Jul. 18, 2000 (JP) .................................. 2000-216891
Jul. 18, 2000 (JP) .................................. 2000-216892
Apr. 18, 2001 (JP) .................................. 2000-119872

(51) Int. Cl.[7] .............................................. H01L 27/00
(52) U.S. Cl. ................. 250/208.1; 257/186; 250/214.1
(58) Field of Search .................... 250/208.1, 214.1; 257/186, E31.038, E31.063, E31.12; 360/246.2, 77.03

(56) References Cited

U.S. PATENT DOCUMENTS

| 4,987,505 A | 1/1991 | Iwabuchi et al. |
| 5,288,989 A | 2/1994 | Ishaque et al. |

FOREIGN PATENT DOCUMENTS

| JP | 01-106342 | 4/1989 | |
| JP | 01-201971 | 8/1989 | |
| JP | 02-058878 | 2/1990 | |
| JP | 02-143471 | 6/1990 | |
| JP | 04-037066 | 2/1992 | |
| JP | 04177881 A | * 6/1992 | ........... H01L/31/10 |
| JP | 10-107310 | 4/1998 | |
| JP | 11-150253 | 6/1999 | |

OTHER PUBLICATIONS

PCT International Search Report, Aug. 21, 2001.

* cited by examiner

Primary Examiner—Thanh X. Luu
Assistant Examiner—Seung C. Sohn
(74) Attorney, Agent, or Firm—RatnerPrestia

(57) ABSTRACT

A light-receiving element array is provided in which the degradation of characteristic thereof due to the crosstalk may be prevented. An n-InP layer, an i-InGaAs layer, and an n-InP layer are stacked on an n-InP substrate. Zn is diffused into the topmost n-InP layer to form a p-type diffused region, resulting in a pin-photodiode. A passivation layer is deposited on the structure to a thickness such that a nonreflective condition is satisfied. On the passivation film, a light-shielding film is provided so as to cover the area between light-receiving elements.

4 Claims, 13 Drawing Sheets

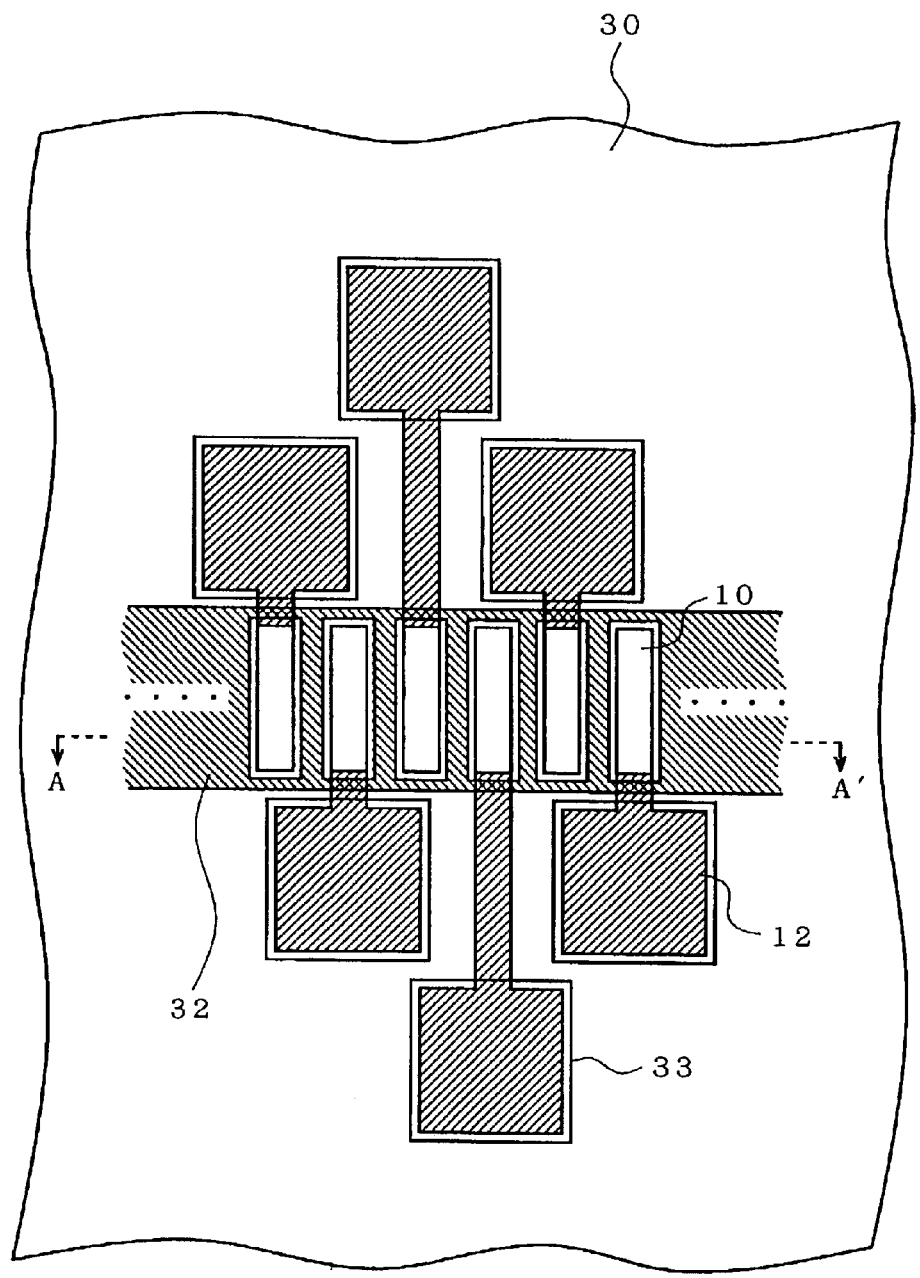
F I G. 4

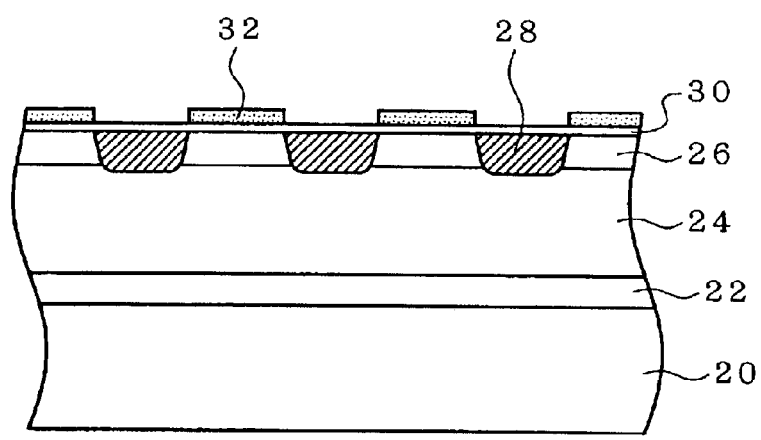
F I G. 5

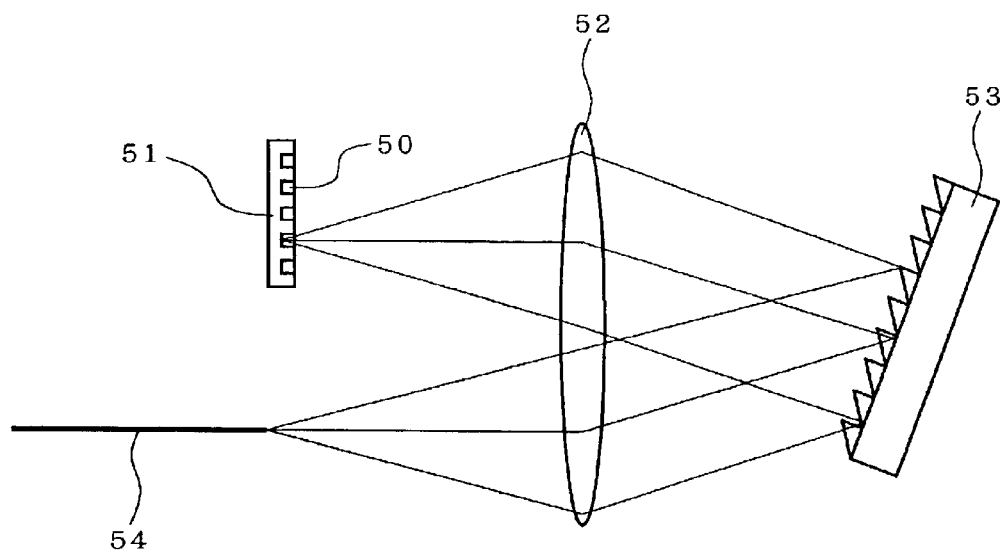
F I G. 8

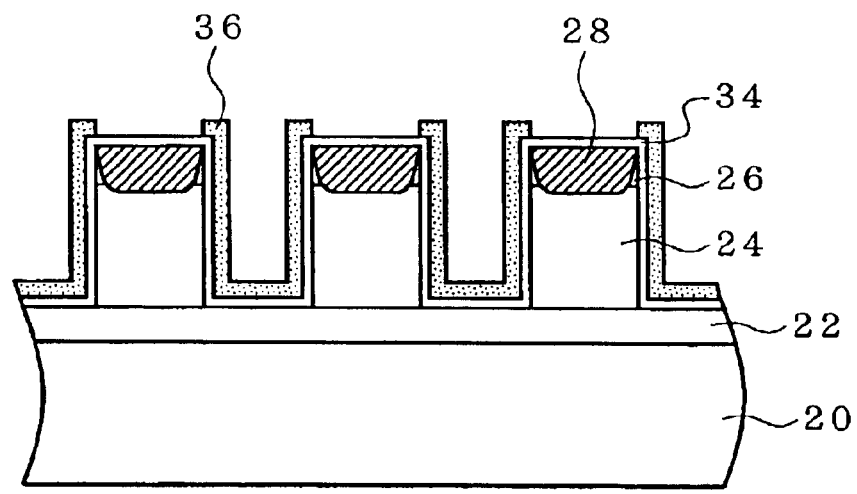
F I G. 1 1
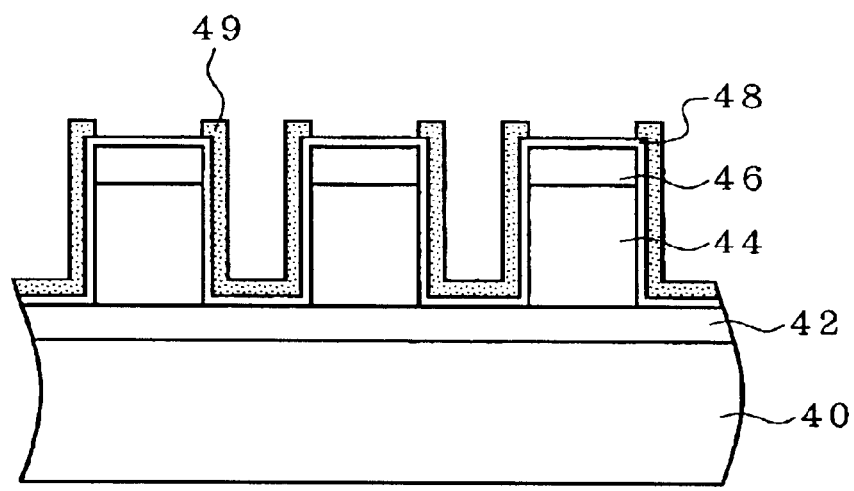
F I G. 1 2

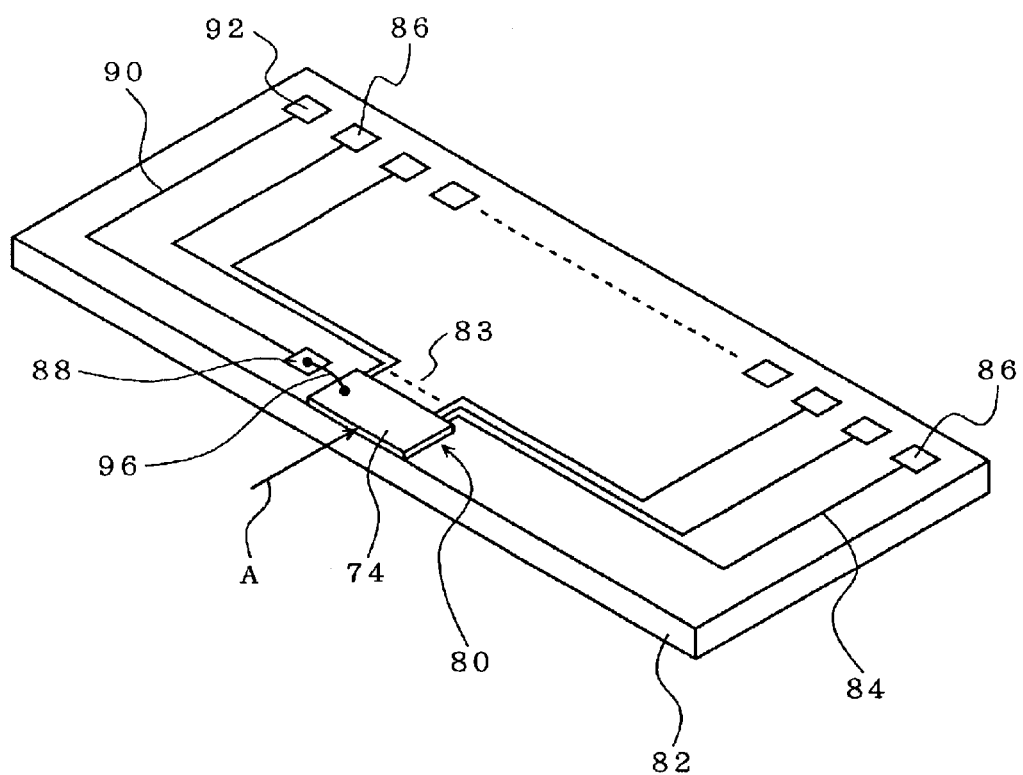
F I G. 1 4

LIGHT RECEIVING ELEMENT ARRAY HAVING ISOLATED PIN PHOTODIODES

TECHNICAL FIELD

The present invention generally relates to a light-receiving element array, particularly to a light-receiving element array in which the crosstalk between light-receiving elements is decreased to prevent the degradation of a characteristic thereof.

BACKGROUND ART

Referring to FIG. 1, there is shown a commercially available light-receiving element array used in an optical demultiplexer for demultiplexing a wavelength multiplexed light and monitoring a spectrum of demultiplexed light. The light-receiving element array is structured by arranging light-receiving elements 10 in a straight line. Electrodes of respective light-receiving elements are connected alternately to bonding pads 12 positioned at both sides of the light-receiving element array.

A light-receiving element implementing a conventional light-receiving element array is a photodiode of pin-structure in which a pn-junction (this region constitutes a light-receiving area) is formed by diffusion. FIG. 2 shows an enlarged partially cross-sectional view of the array taken along the A–A' line in FIG. 1. An n-InP layer (a buffer layer) 22, an undoped (i-) InGaAs layer (a light-absorbing layer) 24, and an n-InP layer (a window layer) 26 are stacked in this order on an n-InP substrate 20. Zn is diffused into the n-InP layer 26 (the diffusion is isotropic so that Zn is laterally diffused) to form a p-type diffused region 28, resulting in a pin-photodiode. In an optical demultiplexer using such a light-receiving element array, each of the demultiplexed lights is required to be entered to the light-receiving area of a corresponding light-receiving element.

In the conventional diffusion-type light-receiving element array, the elements are not isolated to each other, so that a part of the carriers generated in the light-absorbing layer by light absorption migrate to adjacent light-receiving elements by lateral diffusion. This migration of carriers causes the crosstalk toward adjacent light-receiving elements, resulting in the degradation of characteristic for the light-receiving element array.

For example, when an incident light impinges upon the peripheral portion of the diffused region 28 of a light-receiving element as shown in FIG. 3, carriers 27 are generated in a depletion layer 25 under the diffused region. The carriers diffuse outward from the depletion layer just under the diffused region as shown by an arrow 29. The carriers reached to the depletion layer of an adjacent light-receiving element causes the crosstalk.

As a relatively large electrical field is in the depletion region 25, the carriers generated in the depletion region, also, migrate downward along the electrical field. However, if the depletion region 25 is shallow and does not extend to the deep region of the light-absorbing layer 24 as shown in FIG. 3, the carriers are going to laterally diffuse because the electric field is small outside the depletion region, so that the crosstalk is also caused.

In order to cause the depletion region 25 to reach the buffer layer 22, it is preferable that a large reverse bias voltage is applied thereto. However, the depletion region is difficult to be extended, when the carrier concentration in the light-absorbing layer 24 is high.

If the incident light is more spread than the light-receiving area or the incident light partly enters outside the light-receiving area, the light impinges upon the area between light-receiving elements. The light impinged upon outside the light-receiving area (hereinafter referred to as a stray light) causes to generate carriers in the non-depleted light-absorbing layer between light-receiving elements. The carriers laterally diffuse and migrate to adjacent light-receiving elements, resulting in the crosstalk.

If the crosstalk described above is generated, the demultiplexed lights are difficult to be detected precisely, resulting in the degradation of characteristic of a light-receiving element array.

DISCLOSURE OF THE INVENTION

An object of the present invention is to provide a light-receiving element array in which the degradation of characteristic thereof due to the crosstalk may be prevented.

A first aspect of the present invention is a light-receiving element array comprising a plurality of light-receiving elements arrayed in a straight line, each light-receiving element being a pin-photodiode having a p-type or n-type layer formed by diffusion; and a light-shielding film provided on the top surface of the light-receiving element array except at least a part of light-receiving area of each light-receiving element.

A second aspect of the present invention is a light-receiving element array comprising a plurality of light-receiving elements arrayed in a straight line, each light-receiving elements being a pin-photodiode having a p-type or n-type layer formed by diffusion; each light-receiving element constitutes a mesa-structure with the light-receiving elements being isolated to each other by isolation trenches; and a light-shielding film provided on the top surface of the light-receiving element array except at least a part of light receiving area of each light-receiving element.

A third aspect of the present invention is a light-receiving element array comprising a plurality of light-receiving elements arrayed in a straight line, each light-receiving elements being a pin-photodiode formed by crystal growth; each light-receiving element constitutes a mesa-structure with the light-receiving elements being isolated to each other by isolation trenches; and a light-shielding film provided on the top surface of the light-receiving element array except at least a part of light receiving area of each light-receiving element.

A fourth aspect of the present invention is a light-receiving element array comprising a plurality of light-receiving elements arrayed in a straight line, each light-receiving element being a pin-photodiode formed by critical growth; wherein each light-receiving element constitutes a mesa and waveguide-structure with the light-receiving elements being isolated to each other by isolation trenches.

A fifth aspect of the present invention is a light-receiving device, comprising:
 a light-receiving element array including a plurality of light-receiving elements arrayed in a straight line, each light-receiving element being a pin-photodiode formed by critical growth, each light-receiving element constituting a mesa and waveguide-structure with the light-receiving elements being isolated to each other by isolation trenches; and
 a circuit board on which the light-receiving element array is mounted, the circuit board including,
 a pattern of electrode wirings which are formed in the same pitch as that of the second conductivity-type of electrodes, a plurality of first leads for the pattern of electrode wirings, a plurality of first bonding pads connected to the first leads, respectively, one second bonding pad provided near the light-receiving element array on the circuit board, a second lead for the second bonding pad, and a third bonding pad connected to the second lead, wherein the second conductivity-type of electrodes are connected to the pattern of electrode wirings, and the first conductivity-type of electrode is connected to the second bonding pad.

BRIEF DESCRIPTION OF THE DRAWINGS

FIG. 4 is a plan view of a diffusion-type light-receiving element array in accordance with the present invention.

FIG. 5 is an enlarged partially sectional view of the array taken along the A–A' line in FIG. 4.

FIG. 8 is a diagram of an optical system for estimating the demultiplexing characteristic of a light-receiving element array.

FIG. 11 is a cross-sectional view of a diffusion-type light-receiving element array of the present invention in which isolation trenches are formed by etching to electrically isolate light-receiving elements to each other.

FIG. 12 is a cross-sectional view of a mesa-type of light-receiving element array of the present invention in which a p-n junction is formed by crystal growth.

FIG. 14 is a perspective view of the light-receiving device in which the light-receiving element array in FIG. 13 is mounted.

BEST MODE FOR CARRYING OUT THE INVENTION

Figure 1:
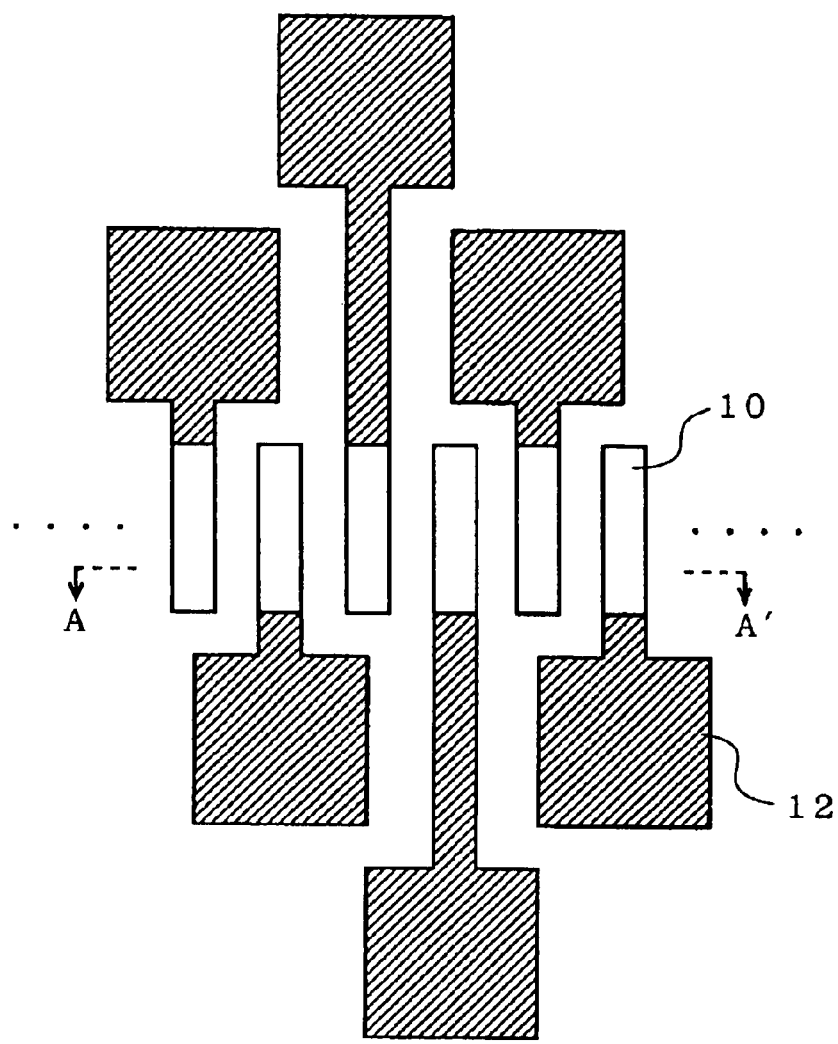
FIG. 1 is a plan view of a conventional diffusion-type light-receiving element array.
Figure 2:
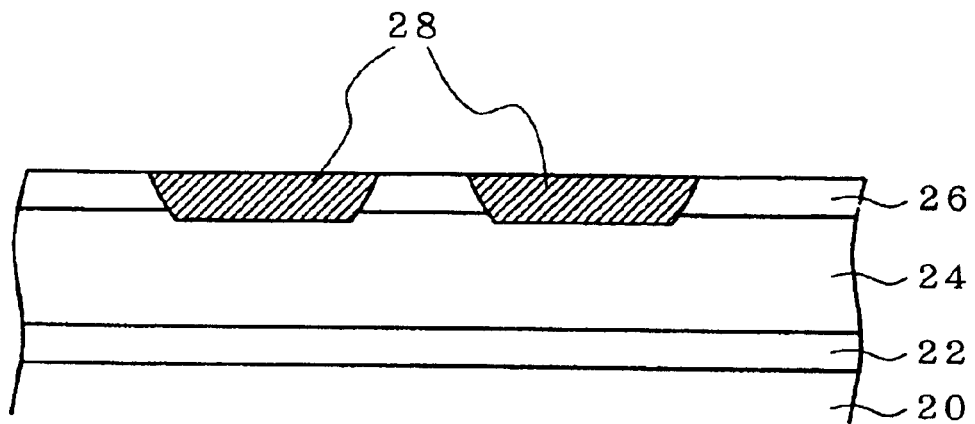
FIG. 2 is an enlarged partially cross-sectional view of the array taken along the A–A' line in FIG. 1
Figure 3:
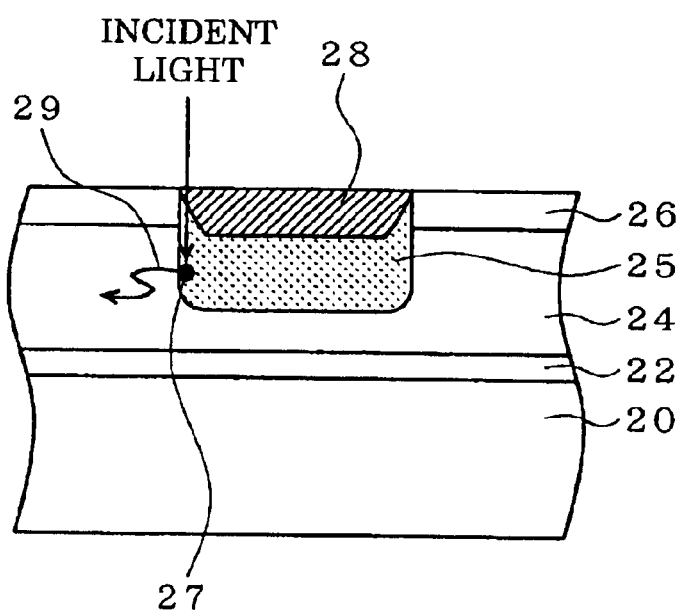
FIG. 3 is a diagram for illustrating the effect of a depletion region in the light-receiving element array in FIG. 2.

Referring to FIG. 4, there is shown a plan view of a light-receiving element array in which a light-shielding film is provided between light-receiving elements of a diffusion-type light-receiving element array shown in FIG. 2 to prevent the degradation of characteristic due to a stray light. FIG. 5 is an enlarged partially cross-sectional view of the array taken along the A–A' line in FIG. 4. It should be noted that in FIGS. 4 and 5 like reference numerals are used for describing like elements in FIGS. 1 and 2.

In this light-receiving element array, a passivation film 30 consisting of SiN film is deposited on the structure shown in FIGS. 1 and 2 to a thickness such that a nonreflective condition is satisfied. On the passivation film 30, a light-shielding film 32 is provided so as to cover the area between light-receiving elements. Openings 33 are opened in the insulating film 30 on respective bonding pads 12 so that a wiring is bonded to each of the bonding pads.

According to the diffusion-type light-receiving element array having the structure described above, even if the incident light is spread with respect to the light-receiving area or the incident light partially impinges upon outside the light-receiving area, the incident light does not enter the area between light-receiving elements because of the presence of the light-shielding film 32. Therefore, carriers are not generated in the non-depleted light-absorbing layer 24 between light-receiving elements, so that there is no degradation of characteristic due to the lateral diffusion of carriers.

Figure 6:
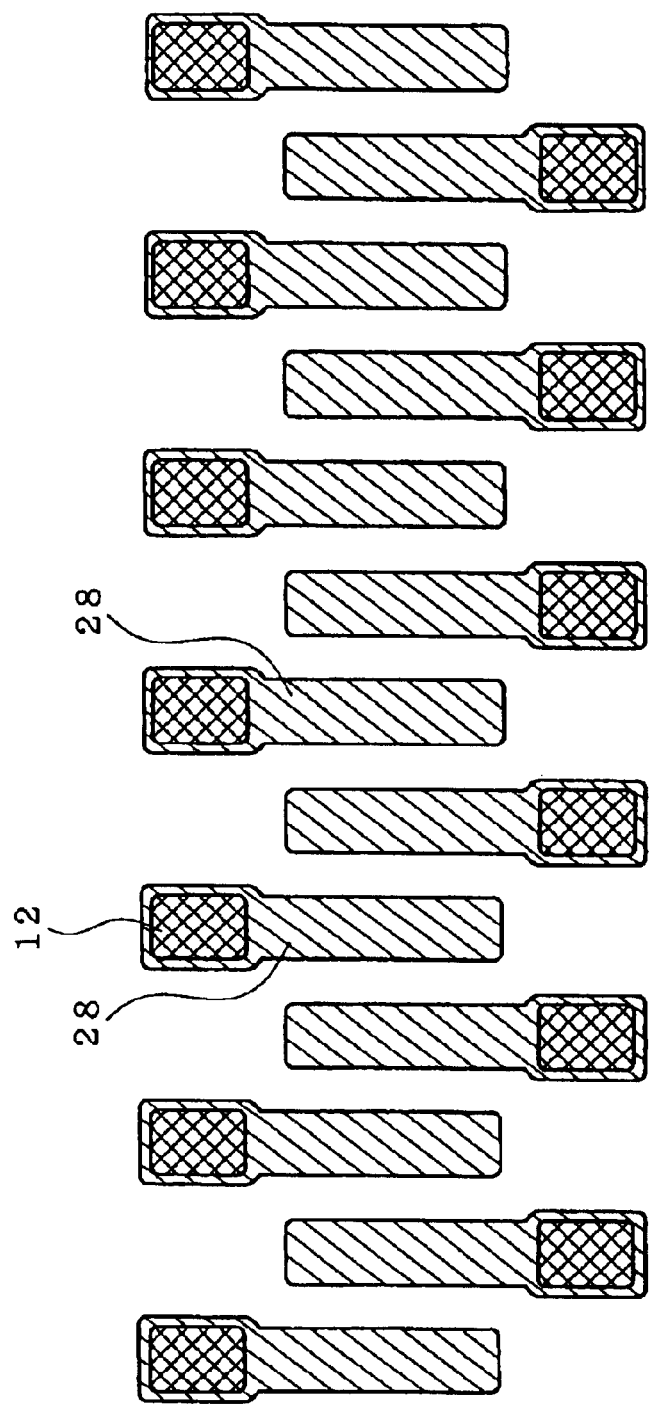
FIG. 6 is a plan view a conventional light-receiving element array prepared to confirm the effect of a light-shielding film.
Figure 7:
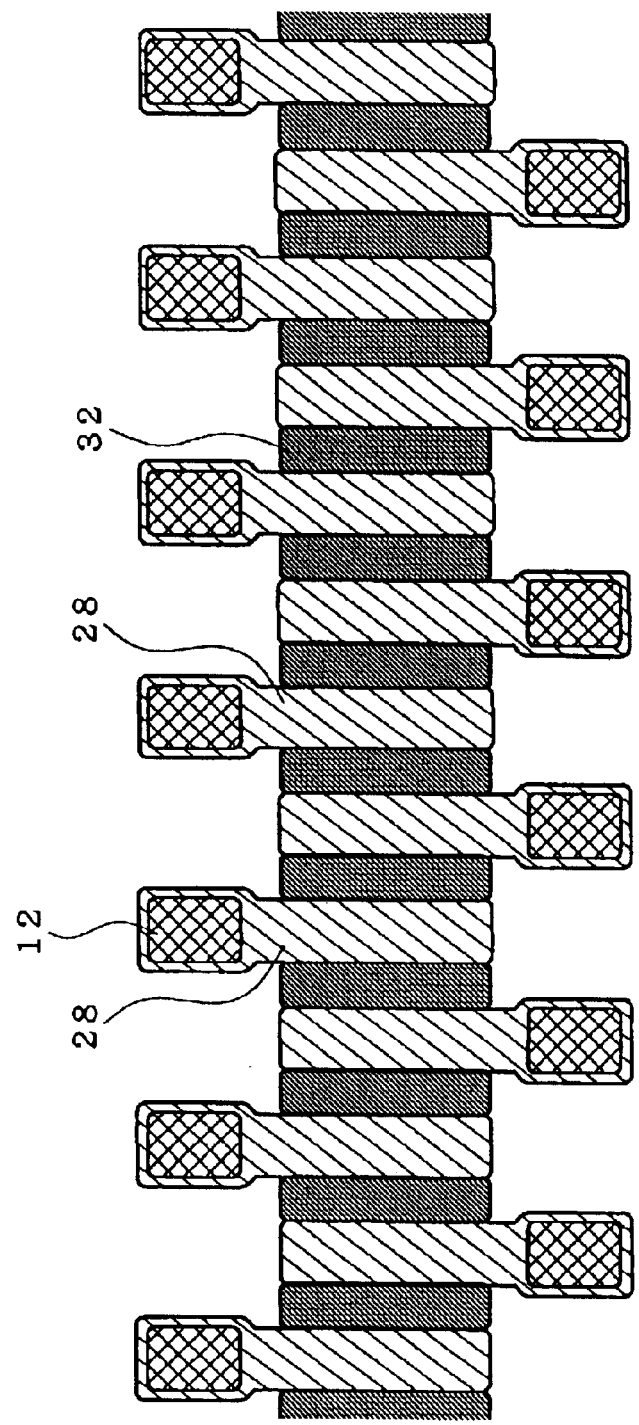
FIG. 7 is a plan view of a light-receiving element array in accordance with the present invention prepared to confirm the effect of a light-shielding film.

In order to confirm the effect of the light-shielding film, two kinds of samples were prepared to carry out a comparison experiment. FIG. 6 shows a plan view a prepared conventional light-receiving element array, while FIG. 7 shows a plan view of a prepared light-receiving element array in accordance with the present invention. In both samples, the substrate was used in which n-InP, undoped (i-) InGaAs, and n-InP were grown in turn by using an MOVPE method. A plasma enhanced CVD SiN film was deposited on the substrate as a passivation film. Zn was diffused from the openings provided in the passivation film to form the diffused regions 28. These diffused regions constituted the light-receiving areas. The light-receiving areas each having a short side of 30 $\mu$m and a long side of 100 $\mu$m were arrayed in a pitch of 50 $\mu$m. Bonding pads 12 each electrically connected to the diffused region 28 of each light-receiving element were positioned alternately on both sides of the light-receiving element array. A wiring (not shown) was bonded to the bonding pad 12.

In a light-receiving element array in accordance with the present invention shown in FIG. 7, a light-shielding film 32 were provided between light-receiving elements using a lift-off method, the light-shielding film having the size of 20 $\mu$m×100 $\mu$m (width×length) and being made of a two-layer film of Ti/Au. The light-shielding film (metal layer) was formed by a vapor deposition using a resistance heating method. A Ti film served for increasing the adhesion to the SiN film, and had a thickness in the range of 50 nm–1 $\mu$m, preferably of about 50 nm. An Au film on the Ti film served for shielding the light, and had a thickness of about 0.2 $\mu$m. A desirable thickness of the Ti/Au layer was totally in the range of 0.2 $\mu$m–10 $\mu$m.

Two kinds of prepared samples of a light-receiving element were estimated by means of an optical system shown in FIG. 8. The light of 1.55 $\mu$m band (i.e., a frequency band used in an optical communication) emitted from a single-mode fiber 54 is collimated by means of a collimator lens 52 having a focal length of about 50 mm, and impinges upon a diffraction grating 53. The grating period of the diffraction grating is selected to be about 1.1 $\mu$m. The collimated light is diffracted by the diffraction grating and demultiplexed into a plurality of lights each having a different wavelength. The demultiplexed lights are focused upon respective light-receiving elements 50 of a light-receiving element array 51 to be estimated by means of the collimator lens 52. The light to be entered to the single-mode fiber 54 is selected to be one wavelength. The diffraction grating 53 is inclined to the optical axis of the collimator lens 52 in such a manner that the output from one light-receiving element to be measured becomes maximum, and the position of the light-receiving element array 51 is adjusted. In this case, the distance between the single-mode fiber 54 and the light-receiving element 51 is selected to be about 2.5 mm in order to reduce a abaxial aberration.

Figure 9:
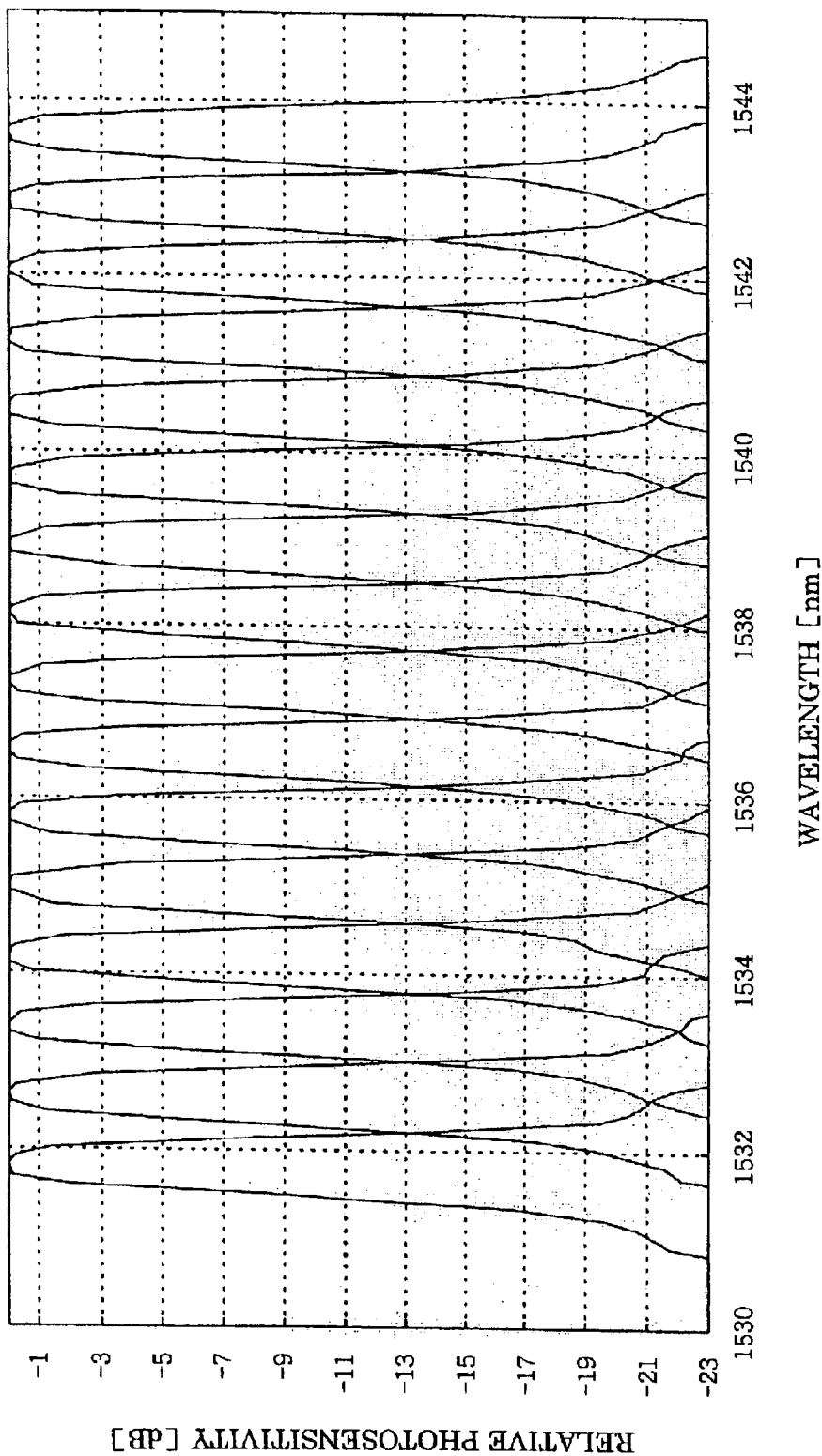
FIG. 9 is a graph showing the demultiplexing characteristic of the light-receiving element array in accordance with the present invention in FIG. 7.
Figure 10:
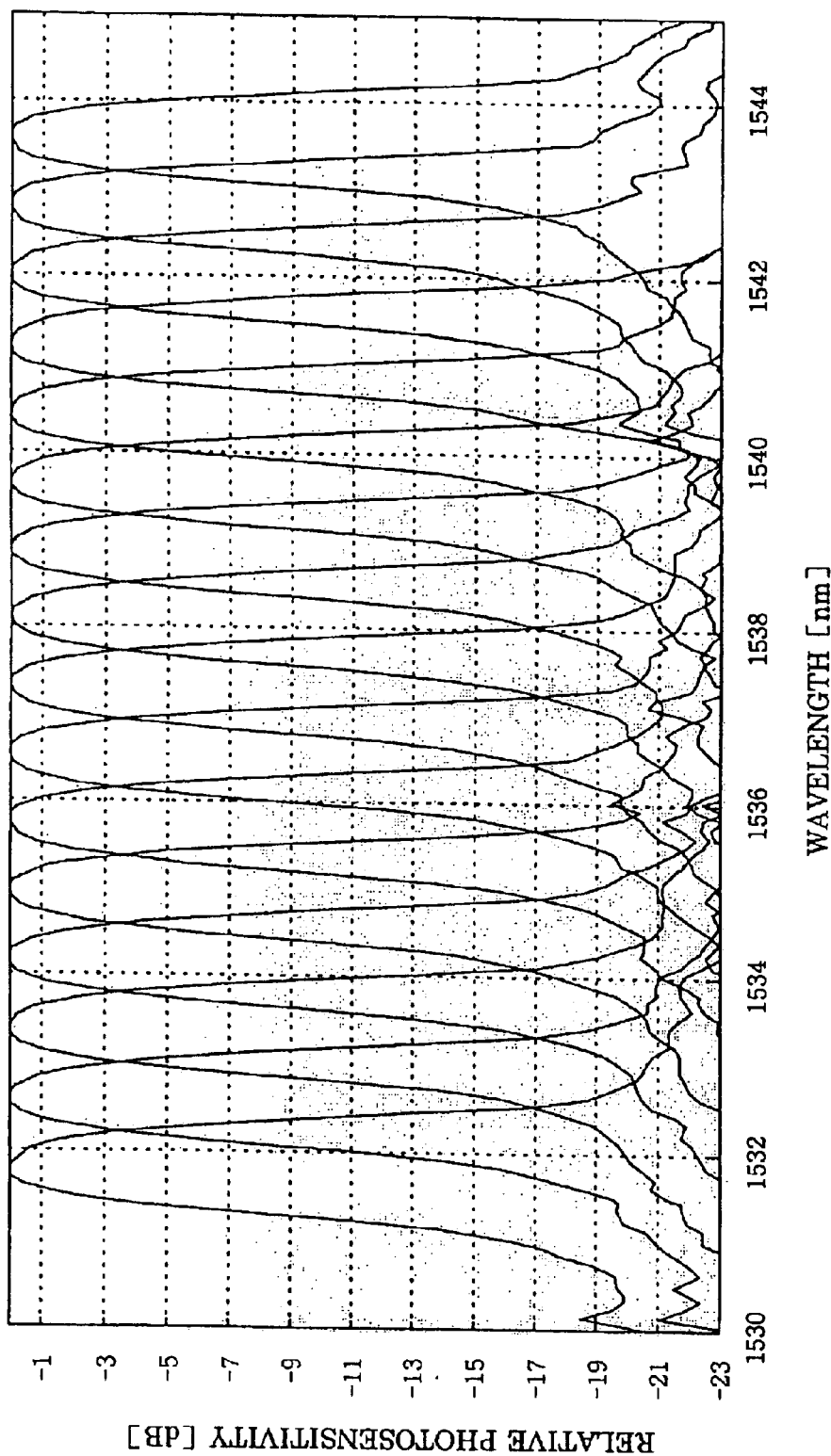
FIG. 10 is a graph showing the demultiplexing characteristic of the conventional light-receiving element array in FIG. 6.

The demultiplexing characteristic of the light-receiving element array in accordance with the present invention in FIG. 7 is shown in FIG. 9, while that of the conventional light-receiving element array in FIG. 6 is shown in FIG. 10 as a comparison example. In FIGS. 9 and 10, the ordinate designates a relative photosensitivity (dB) and the abscissa a wavelength (nm).

Apparent from these demultiplexing characteristics, the conventional light-receiving element array had the crosstalk of about −15 dB, whereas the crosstalk decreased to −18 dB or less by using the light-receiving element array in accordance with the present invention, which designated an improvement of 3 dB or more. It should be noted that the crosstalk is determined by the relative photosensitivity at a position where a vertical line drawn from the peak of a demultiplexing characteristic curve of any one of demultiplexed lights crosses to the adjacent demultiplexing characteristic curve.

For the sample shown in FIG. 7, each width of the light-shielding film and the light-receiving area is selected in such a manner that the light-shielding film and the light-receiving area are not overlapped, or there is no space between them. However, this is not an indispensable condition, and the same effect may be obtained when the width of the light-shielding film is increased to 40 $\mu$m from 20 $\mu$m or is decreased to 10 $\mu$m.

While the light-receiving element array in which the elements are arrayed in a pitch of 50 $\mu$m is used in the sample of FIG. 7, the same effect may be obtained when the light-receiving element array in which the elements are arrayed in a pitch of 25 $\mu$m is used. In this case, the width of a light-receiving area is selected to be 12 $\mu$m, and the width of a light-shielding film 13 $\mu$m. While the width of a light-shielding film (20 $\mu$m width) is selected in such a manner that the light-shielding film is not overlapped to a light-receiving element (30 $\mu$m width) in the sample in FIG. 7, the light-shielding film may be overlapped to the light-receiving area if an opening remains in the light-shielding film on the light-receiving area.

While a metal film of two-layer structure, i.e. a Ti/Au film is used as the material of the light-shielding film in the sample shown in FIG. 7, a single-layer film such as an Au film, a three-layer film such as a Ti/Pt/Au film, or a four or more—layer film may be used. The metal material and the thickness of a light-shielding film are not limited to that illustrated in the sample of FIG. 7. For example, Al is preferable for a passivation film because of its facility of deposition and patterning. Also, when a carbon film of 0.2–10 $\mu$m thick deposited by an ark vapor deposition is used in place of a metal film as a light-shielding film, the same effect may be obtained.

A structure for further decreasing the crosstalk in the diffusion-type light-receiving element array will be described hereinafter. FIG. 11 shows a mesa-type light-receiving element array in which isolation trenches are formed by etching to electrically isolate light-receiving elements to each other. It should be noted that in FIG. 11 like reference numerals are used for describing like elements in FIGS. 1 and 2.

Isolation trenches are etched between diffused regions, and then a passivation film 34 is deposited on all the surface of the structure to a thickness such that a nonreflective condition is satisfied. A light-shielding film 36 is then deposited on the passivation film 34 except the light-receiving areas, i.e., the light-shielding film is deposited on the bottom and side wall of the isolating trench, and on the top surface of the light-receiving element except the diffused region 28. The plan view of the light-receiving element array of the present embodiment is the same as that in FIG. 4.

According to the mesa and diffusion-type light-receiving element array, the carriers generated in the light-absorbing layer 24 can not migrate toward the adjacent light-receiving elements by lateral diffusion because the light-receiving elements are electrically isolated to each other. The light obliquely impinging upon the isolating trench is shielded by the light-shielding film 36 deposited on the side wall of the isolating trench. Consequently, the light-receiving element is not affected by the light that would impinge upon outside the light-receiving area unless the light-shielding is deposited in the isolating trench.

Therefore, in this mesa and diffusion-type light-receiving element array, the crosstalk may be further decreased in comparison with the diffusion-type light-receiving element array in FIG. 4.

A p-n junction is formed by diffusion in the mesa and diffusion-type light-receiving element array. The diffusion is isotropic, and then proceeds laterally more than a diffusion depth. The size and array pitch of a light-receiving element array are the same as in the conventional diffusion-type light-receiving element array.

Referring to FIG. 12, there is shown a light-receiving element array in which a p-n junction is formed by crystal growth in place of diffusion, and isolation trenches are formed by etching to make a mesa-structure.

An n-InP layer 42, an i-InGaAs layer (a light-absorbing layer) 44, and a p-InP layer (a window layer) 46 are stacked in turn by crystal growth on an n-InP substrate 40. The InGaAs layer 44 and InP layer 46 are etched to form trenches for isolating the elements to each other. A passivation film 48 is deposited on all the top surface of the structure to a thickness such that a nonreflective condition is satisfied. A light-shielding film 49 is then deposited on the passivation film 48 except the light-receiving areas. The diagram of the top surface of the light-receiving element array of the present embodiment is the same as that in FIG. 4. According to this light-receiving element array, a high density integration may be possible in comparison with the diffusion-type light-receiving element array in FIG. 11.

In the respective embodiments described above, the light-shielding film is formed only between light-receiving elements. However, if wirings and electrodes are further shielded by the light-shielding film to suppress the generation of a stray light, the device characteristic may be improved.

Figure 13:
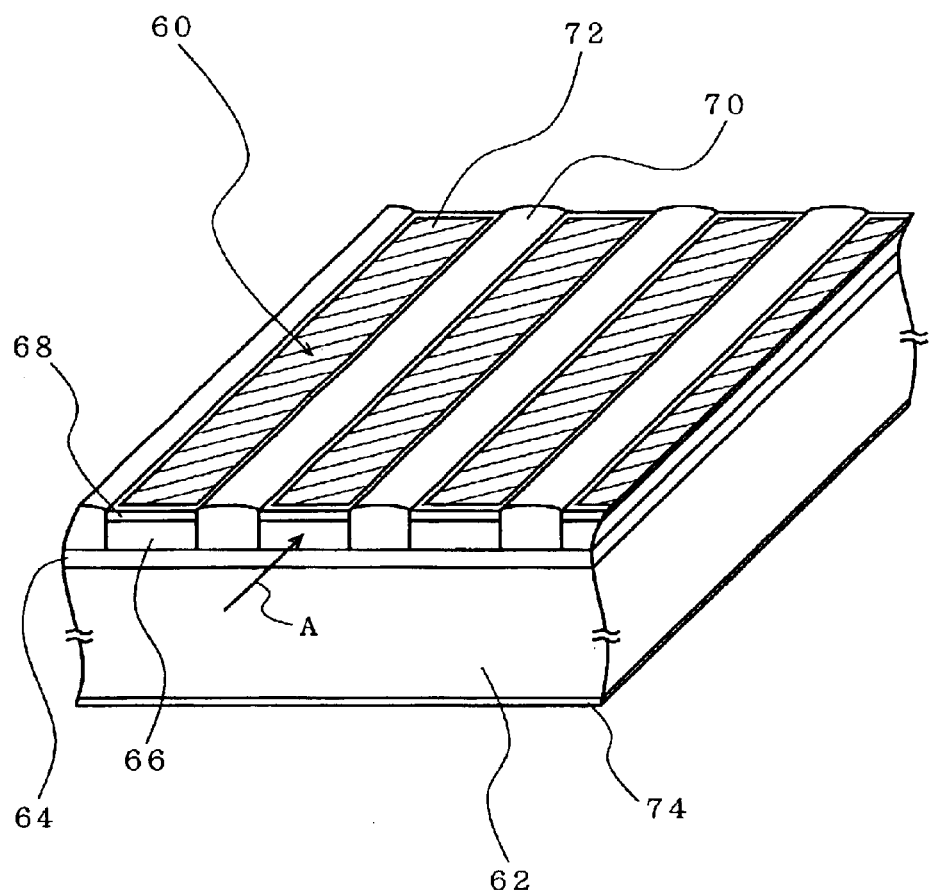
FIG. 13 is a perspective view of a waveguide-type light-receiving element array in accordance with the present invention.

Referring to FIG. 13, there is shown another example of a mesa-type light-receiving element array which may be fabricated by crystal growth and be integrated in a high density. In this light-receiving element array, a light-receiving element consists a waveguide. FIG. 13 is a perspective view of this light-receiving element array in which waveguide-type light-receiving elements 60 each having a width of 6 $\mu$m are arrayed in a pitch of 10 $\mu$m.

This light-receiving element array may be fabricated in the following manner. An n-InP layer 64, an i-InGaAs layer 66, and a p-InP layer 68 are grown in turn on an n-InP substrate 62 by MOVPE and the like. At this time, the second layer, i.e. the i-InGaAs layer 66 may be a non-doped or lightly-doped layer.

The p-InP layer 68 and i-InGaAs layer 66 are removed to form isolation trenches by mesa etching until the surface of the n-InP layer 64 is partially exposed. As a result, a waveguide structure is fabricated.

Next, an i-InP is regrown in the isolation trenches. The isolation trenches are buried and planarlized by the regrown i-InP. In the figure, the buried region is shown by the reference numeral 70. While i-InP is given as one example of the material to be buried, any material may be used which has an optical confinement effect and a sufficient dielectric strength for adjacent light-receiving elements. For example, an electrically insulating material such as Fe-doped InP is more preferable. Finally, a p-type ohmic electrode 72 is formed on the topmost layer, i.e. the p-InP layer 68, and an n-type ohmic electrode is formed on the bottom surface of the substrate.

In the waveguide-type light-receiving element array fabricated in a manner described above, a p-n junction is not formed by diffusion, so that an array pitch of light-receiving elements may be decreased.

Also, in the waveguide-type light-receiving element array, the light impinges upon the end face such as a cleavage plane of the substrate as shown by an arrow A in the figure. The photosensitivity of the waveguide light-receiving element array depends on the propagation length of the light in the InGaAs layer 66 (the light-absorbing layer). On the contrary, the photosensitivity depends on the thickness of the InGaAs layer in the diffusion-type light-receiving element as well as the mesa-type light-receiving element in which the light impinges upon the substrate vertically. Therefore, in the waveguide-type light-receiving element array, the length of the InGaAs layer constituting a waveguide may be substantially larger than the thickness thereof, so that the improvement of the photosensitivity would be expected.

While the isolation trenches are buried by the regrowth of i-InP, they may be buried by the deposition of an insulating film. Also, the device characteristic of the light-receiving element array may be improved by applying a nonreflective coating on the end surface of the substrate upon which the light impinges.

In the waveguide-type light-receiving element array of the present embodiment, the crosstalk may be also decreased because the light-receiving elements are isolated to each other by the isolation trenches.

Next, a light-receiving device in accordance with the present invention will now be described, the device using the waveguide-type light-receiving element array shown in FIG. 13. This light-receiving device may be preferably applied to an optical demultiplexer. The light-receiving device is fabricated by mounting the light-receiving element array on a circuit board.

Figure 15:
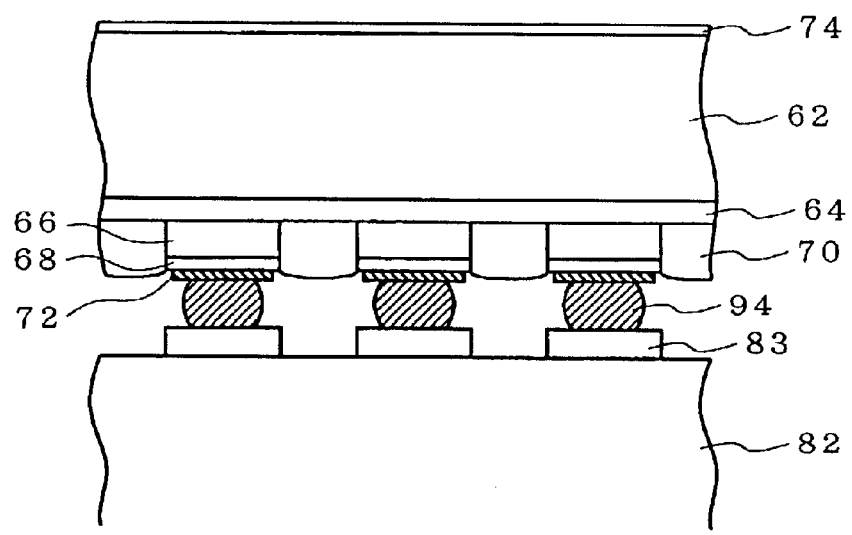
FIG. 15 is a cross-sectional view for illustrating the flip chip bonding.

One example in which the light-receiving element array is mounted by flip chip bonding is shown in FIGS. 14 and 15. FIG. 14 is a perspective view of the light-receiving device, and FIG. 15 a cross-sectional view for illustrating the flip chip bonding.

An alumina substrate 82 is prepared as a circuit board. On the alumina substrate, there are provided a pattern of electrode wirings 83 which are formed in the same pitch as that of p-type ohmic electrodes 72 (see the FIG. 13) in the waveguide-type light-receiving element array to be mounted, a plurality of leads 84 for the electrode wirings, a plurality of bonding pads 86 connected to the leads 84, one bonding pad 88 provided near the light-receiving element array 80, a lead 90 connected to the bonding pad 88, and one bonding pad 92 connected to the lead 90. One bonding pad 92 and the plurality of bonding pads 86 are arrayed in a straight line.

The waveguide-type light-receiving element array 80 is mounted on the pattern of electrode wirings 83 by flip chip bonding, for example, with the p-type ohmic electrodes 72 facing down to the pattern 83 and the n-type ohmic electrode 74 facing upward.

According to the flip chip bonding, solder bumps are provided in advance on the pattern of electrode wirings 83 as shown in FIG. 15, and the p-type ohmic electrodes 72 of the light-receiving element array 80 are aligned and heat-adhered to the solder bumps.

Therefore, the respective p-type ohmic electrodes 72 corresponding to the respective waveguides of the light-receiving element array are connected to the bonding pads 86 arrayed on the alumina substrate 82 through the solder bumps 94, the pattern of electrode wirings 83, and the leads 84. Also, the n-type ohmic electrode 74 of the waveguide-type light-receiving element array 80 is connected to the bonding pad 88 provided near the array via a bonding wire 96, the bonding pad 88 being connected to the bonding pad 92 through the lead 90.

If a bonding pad to be electrically connected to the ohmic electrode 74 is formed on a light-receiving surface of the array 80, it may be connected to the lead 90 by flip chip bonding without using the bonding wire 96.

In the waveguide-type light-receiving element array having the structure described above, the light impinges upon the end surface of the substrate as shown by an arrow A in the figure.

According to the waveguide light-receiving element array, an electrical isolation between adjacent light-receiving elements may easily be implemented, because a mesa-structure is employed for a light-receiving element. As a result, the crosstalk between elements may be decreased and the size and array pitch of the light-receiving element array may be smaller.

Also, according to the waveguide-type light-receiving element array, the light propagates not vertically but horizontally in the light-absorbing layer, so that the area interacting with the light becomes large to improve the device characteristic such as a photosensitivity.

Further, according to the light-receiving device, the waveguide-type light-receiving element array may be mounted on a circuit board by flip chip bonding because the light impinges upon the end surface of the substrate. In this case, bonding pads may be provided on the circuit board, so that it is unnecessary to form bonding pads on a light-receiving element array chip, resulting in the reduction of the chip size. Therefore, the number of chips obtained from one wafer is increased.

INDUSTRIAL APPLICABILITY

According to the light-receiving element array in accordance with the present invention, the crosstalk may be decreased and the degradation of characteristic of a light-receiving element array may be prevented because a light-shielding film is provided in order that a stray light does not impinge upon outside light-receiving areas.

Also, the carriers generated by the light do not migrate toward adjacent elements because isolation trenches are provided to electrically isolate light-emitting elements to each other. As a result, the current flowing to adjacent elements is not generated, and then the crosstalk may be decreased and the degradation of characteristic of a light-receiving element array may be prevented.

What is claimed is:

1. A light-receiving element array, comprising:
   a plurality of pin-photodiodes arrayed in a straight line, each of the pin-photodiodes being formed by crystal growth on a first conductivity-type of substrate, and constituting a mesa and waveguide-structure with the pin-photodiodes being isolated from each other by isolation trenches;
   a first conductivity-type of electrode formed on the bottom surface of the substrate; and
   a plurality of second conductivity-type, opposite to the first conductivity-type, electrodes being formed on top surfaces of respective ones of the plurality of pin-photodiode;
   wherein light impinges upon end surfaces of the pin-photodiodes, the end surfaces being substantially perpendicular to the second conductivity-type of electrode of the pin-photodiodes.

2. The light-receiving element array of claim 1, wherein the first conductivity-type is p-type and the second conductivity-type is n-type.

3. A light-receiving device, comprising:
   a light-receiving element array of claim 1; and
   a circuit board on which the light-receiving element array is mounted, the circuit board including,
   a pattern of electrode wirings which are formed in the same pitch as that of the second conductivity-type of electrodes,
   a plurality of first leads for the pattern of electrode wirings,
   a plurality of first bonding pads connected to the first leads, respectively, one second bonding pad provided near the light-receiving element array on the circuit board;
   a second lead for the second bonding pad, and
   a third bonding pad connected to the second lead,
   wherein the second conductivity-type of electrodes are connected to the pattern of electrode wirings, and the first conductivity-type of electrode is connected to the second bonding pad.

4. The light-receiving device of claim 3, wherein the first conductivity-type is p-type and the second conductivity-type is n-type.

* * * * *